(12) United States Patent
Benveniste et al.

(10) Patent No.: US 7,820,988 B2
(45) Date of Patent: Oct. 26, 2010

(54) IMPLANT UNIFORMITY CONTROL

(75) Inventors: Victor M. Benveniste, Lyle, WA (US);
Antonella Cucchetti, Beverly, MA (US);
Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 238 days.

(21) Appl. No.: 12/244,001

(22) Filed: Oct. 2, 2008

(65) Prior Publication Data
US 2010/0084581 A1    Apr. 8, 2010

(51) Int. Cl.
*H01J 37/317* (2006.01)
*H01L 21/265* (2006.01)

(52) U.S. Cl. .............................. 250/492.21; 250/492.2; 250/492.3; 250/396 R; 250/423 R; 250/424

(58) Field of Classification Search ............ 250/492.21, 250/492.2, 492.3, 396 R, 423 R, 424
See application file for complete search history.

(56) References Cited

U.S. PATENT DOCUMENTS

| 6,879,109 | B2 * | 4/2005 | Benveniste et al. ..... | 315/111.21 |
| 7,589,333 | B2 * | 9/2009 | Graf et al. .............. | 250/492.21 |
| 2008/0078957 | A1 * | 4/2008 | Graf et al. .............. | 250/492.21 |

* cited by examiner

*Primary Examiner*—Nikita Wells

(57) ABSTRACT

An apparatus and method for ion implantation that include destabilizing the ion beam as it passes through magnetic field, preferably a dipole magnetic field is disclosed. By introducing a bias voltage at certain points within the magnetic field, electrons from the plasma are drawn toward the magnet, thereby causing the ion beam to expand due to space charge effects. The bias voltage can be introduced into the magnet in a region where the magnetic field has only one component. Alternatively, the bias voltage can be in a region wherein the magnetic field has two components.

23 Claims, 11 Drawing Sheets

Ion Beam Direction

IMPLANT UNIFORMITY CONTROL

BACKGROUND OF THE INVENTION

Ion implanters are commonly used in the production of semiconductor wafers. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

A block diagram of a representative ion implanter 100 is shown in FIG. 1. Power supply 101 supplies the required energy to the ion source 102 to enable the generation of ions. An ion source 102 generates ions of a desired species. In some embodiments, these species are mono-atoms, which are best suited for high-energy implant applications. In other embodiments, these species are molecules, which are better suited for low-energy implant applications. The ion source 102 has an aperture through which ions can pass. These ions are attracted to and through the aperture by electrodes 104. These exiting ions are formed into a beam 10, which then passes through a mass analyzer 106. The mass analyzer, having a resolving aperture, is used to remove unwanted components from the ion beam, resulting in an ion beam having the desired energy and mass characteristics passing through resolving aperture. Ions of the desired species then pass through a deceleration stage 108, which may include one or more electrodes. The output of the deceleration stage is a diverging ion beam.

A corrector, or collimator, magnet 110 is adapted to deflect the divergent ion beam into a set of beamlets having substantially parallel trajectories. Preferably, the collimator magnet 110 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 110, the ribbon beam is targeted toward the workpiece. In some embodiments, a second deceleration stage 112 may be added. The workpiece is attached to a workpiece support 114. The workpiece support 114 provides a variety of degrees of movement for various implant applications.

The components between the ion source and the workpiece comprise the beamline. These components transform the ions generated by the ion source into a ribbon beam capable of implanting ions into a workpiece, such as a semiconductor wafer.

The workpiece support is used to both hold the wafer in position, and to orient the wafer so as to be properly implanted by the ion beam. To effectively hold the wafer in place, most workpiece supports typically use a circular surface on which the workpiece rests, known as a platen. Often, the platen uses electrostatic force to hold the workpiece in position. By creating a strong electrostatic force on the platen, also known as the electrostatic chuck, the workpiece or wafer can be held in place without any mechanical fastening devices. This minimizes contamination and also improves cycle time, since the wafer does not need to be unfastened after it has been implanted. These chucks typically use one of two types of force to hold the wafer in place: coulombic or Johnson-Rahbeck force.

The workpiece support typically is capable of moving the workpiece in one or more directions. For example, in ion implantation, the ion beam is typically a scanned or ribbon beam, having a width much greater than its height. Assume that the width of the beam is defined as the x axis, the height of the beam is defined as the y axis, and the path of travel of the beam is defined as the z axis. The width of the beam is typically wider than the workpiece, such that the workpiece does not have to be moved in the x direction. However, it is common to move the workpiece along the y axis to expose the entire workpiece to the beam.

The uniformity of the ion beam is critical to successful implantation. Low energy levels, such as those used for shallow implants, make it even more difficult to maintain ion beam uniformity. If the concentration of ions across the beam width is uneven, the implanted substrate will have non-uniform characteristics and parameters, which will affect its performance and usefulness.

SUMMARY OF THE INVENTION

The problems of the prior art are overcome by the ion implantation apparatus and method described in the present disclosure. The disclosure provides an apparatus and method for ion implantation that include destabilizing the ion beam as it passes through a magnetic field, preferably a dipole magnetic field. By introducing a bias voltage at certain points within that magnetic field, electrons from the plasma are drawn toward the electrodes, thereby causing the ion beam to expand due to space charge effects. The bias voltage can be introduced into the magnet in a region where the magnetic field has only one component. Alternatively, the bias voltage can be in a region wherein the magnetic field has two components.

DETAILED DESCRIPTION OF THE INVENTION

Figure 11:
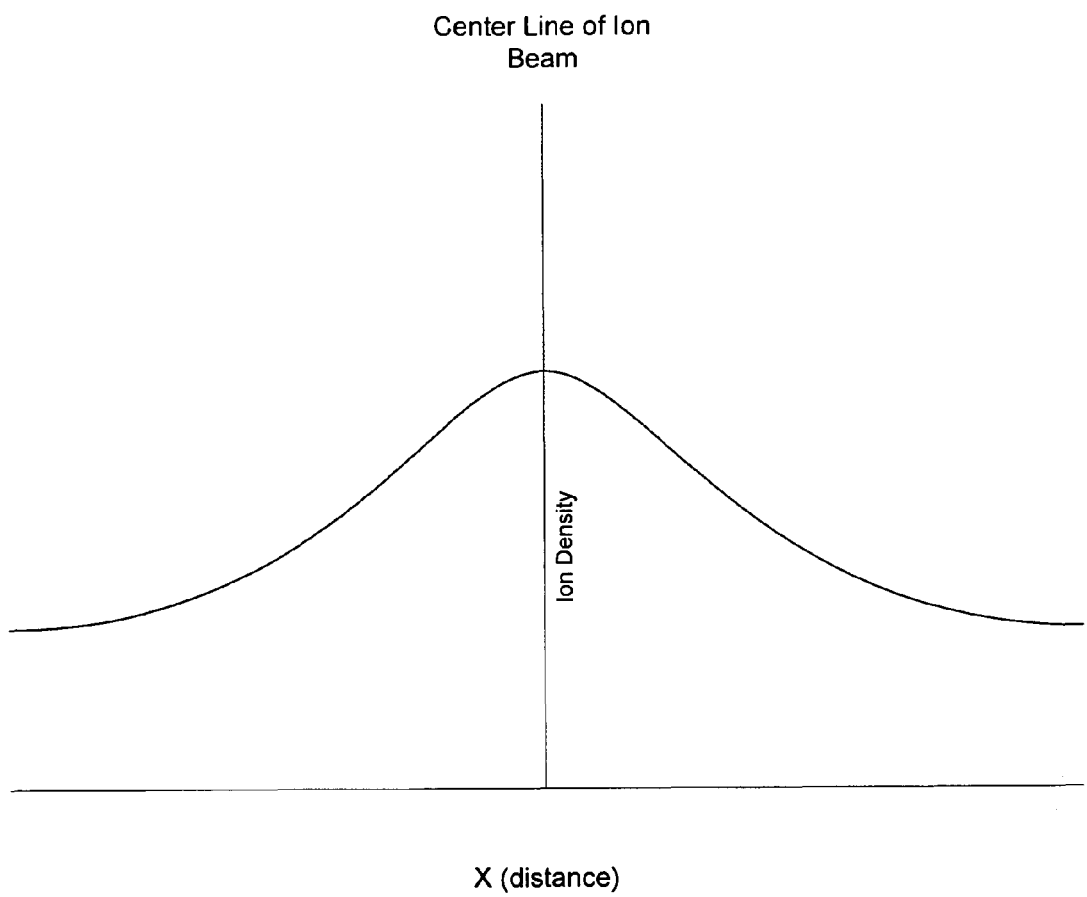
FIG. 11 illustrated a representative ion density distribution for a low energy level ion beam.

As described above, the ion beam passes through various components before reaching the workpiece. One challenge in this process is to insure that the ion beam remain uniform across its width. In some cases, the ions tend to congregate close to the center, with fewer on either side of the centerline, as shown in FIG. 11. This results in an uneven ion implantation in the workpiece.

Figure 2:
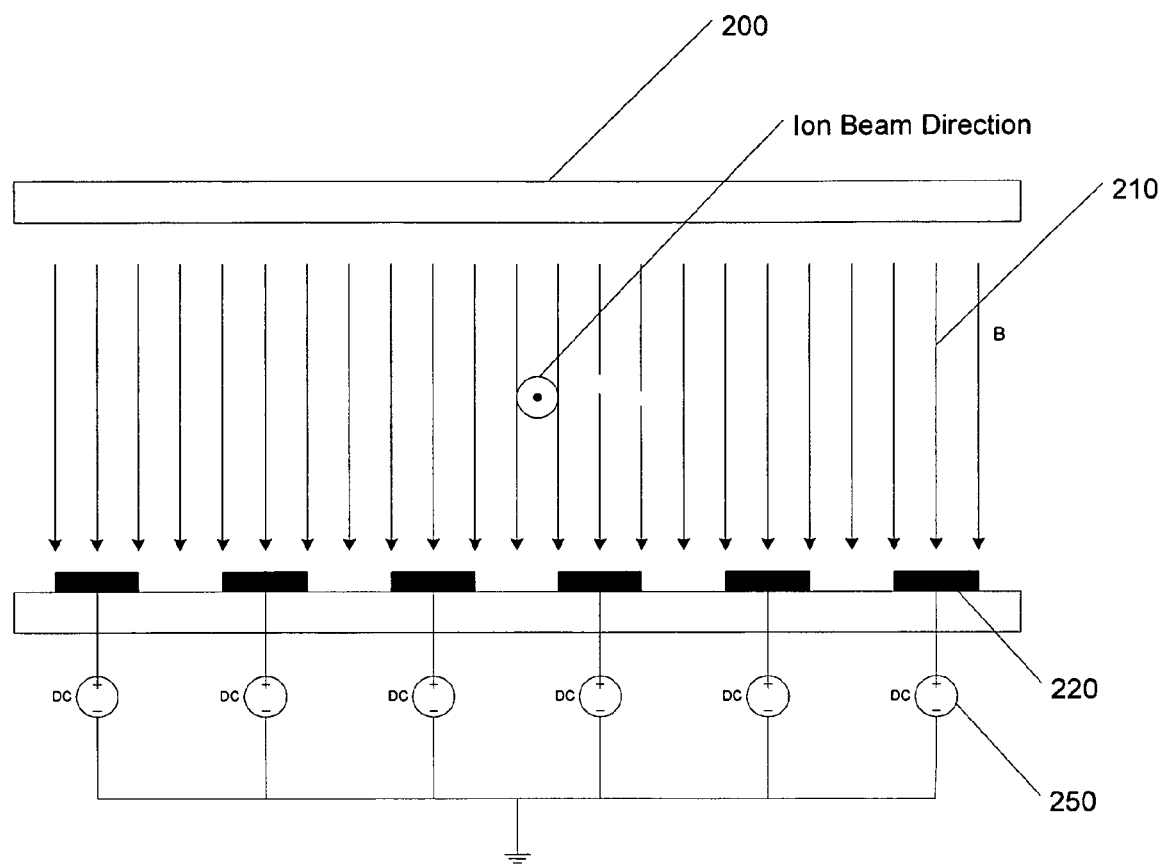
FIG. 2 represents a cross-section of the collimator magnet in FIG. 1, taken in the x-y plane.

FIG. 2 shows a first embodiment. The vertical lines 210 represent the magnetic (B) field within the collimator magnet 200, while the ⊙ represents the path of the ion beam, coming out of the page. In this embodiment, electrical conductors, or electrodes 220, preferably in the shape of strips, are inserted in the dipole magnetic field of the collimator magnet 200. In one embodiment, the electrodes 220 are affixed directly to the magnet 200, so as to remain out of the beam path. The electrodes 220 can be affixed to either the north or south poles, or both poles, if desired. Alternatively, the electrodes can be held in place using other methods. The only requirement is that the electrodes be electrically isolated from their environment. Each electrode 220 is preferably in communication with an independent power supply 250, which is used to supply a bias voltage to the electrode.

Figure 3:
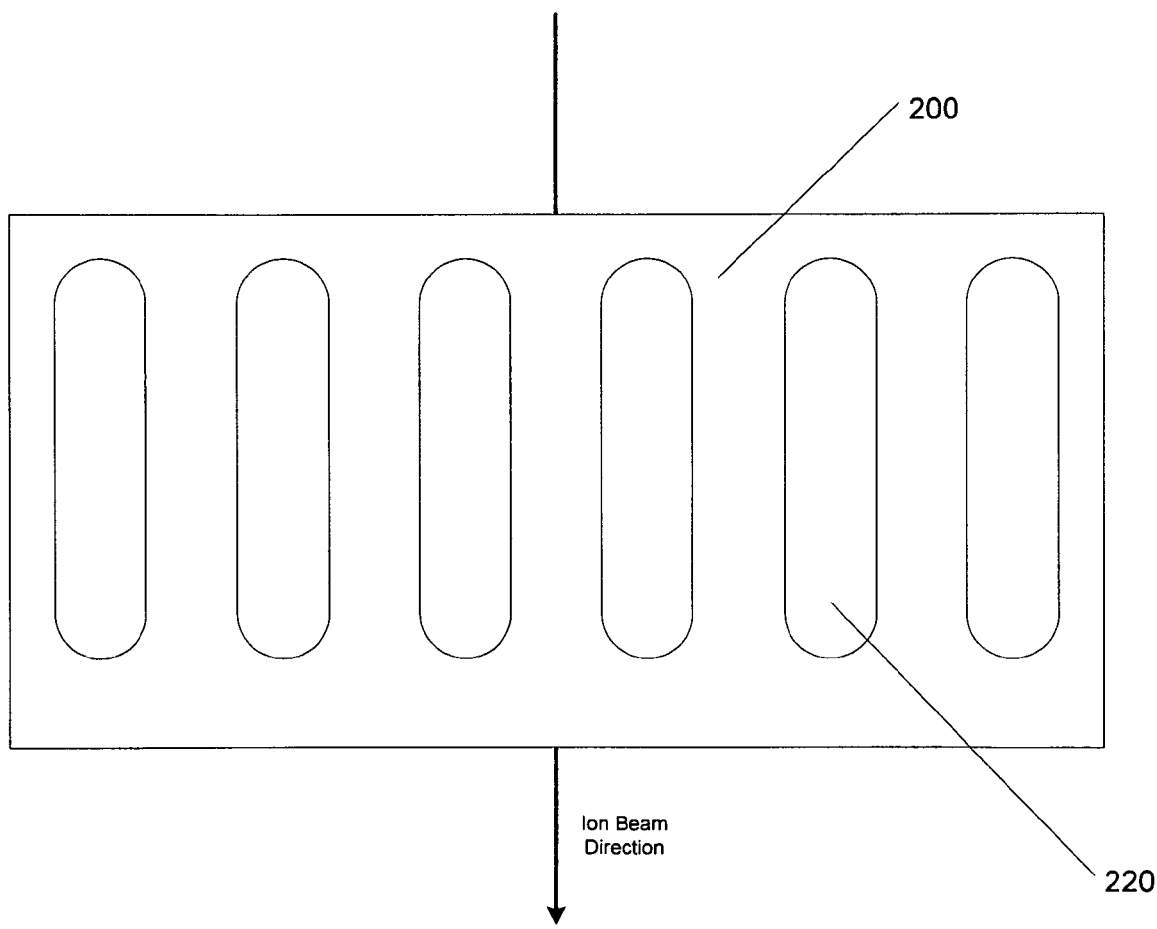
FIG. 3 represents a top view of a first embodiment of the electrodes shown in FIG. 2, taken in the x-z plane.

FIG. 3 shows one possible shape of the electrodes. These electrodes 200 can be printed circuit strips. In certain embodiments, these strips are 1 inch wide, 2 inches long and 0.125 inches thick, although other dimensions are within the scope of the disclosure. In the preferred embodiment, each electrode is in communication with an independent power supply (as shown in FIG. 2), such that the bias voltage applied to any electrode is independent of the bias voltage applied to any other electrode.

Figure 4:
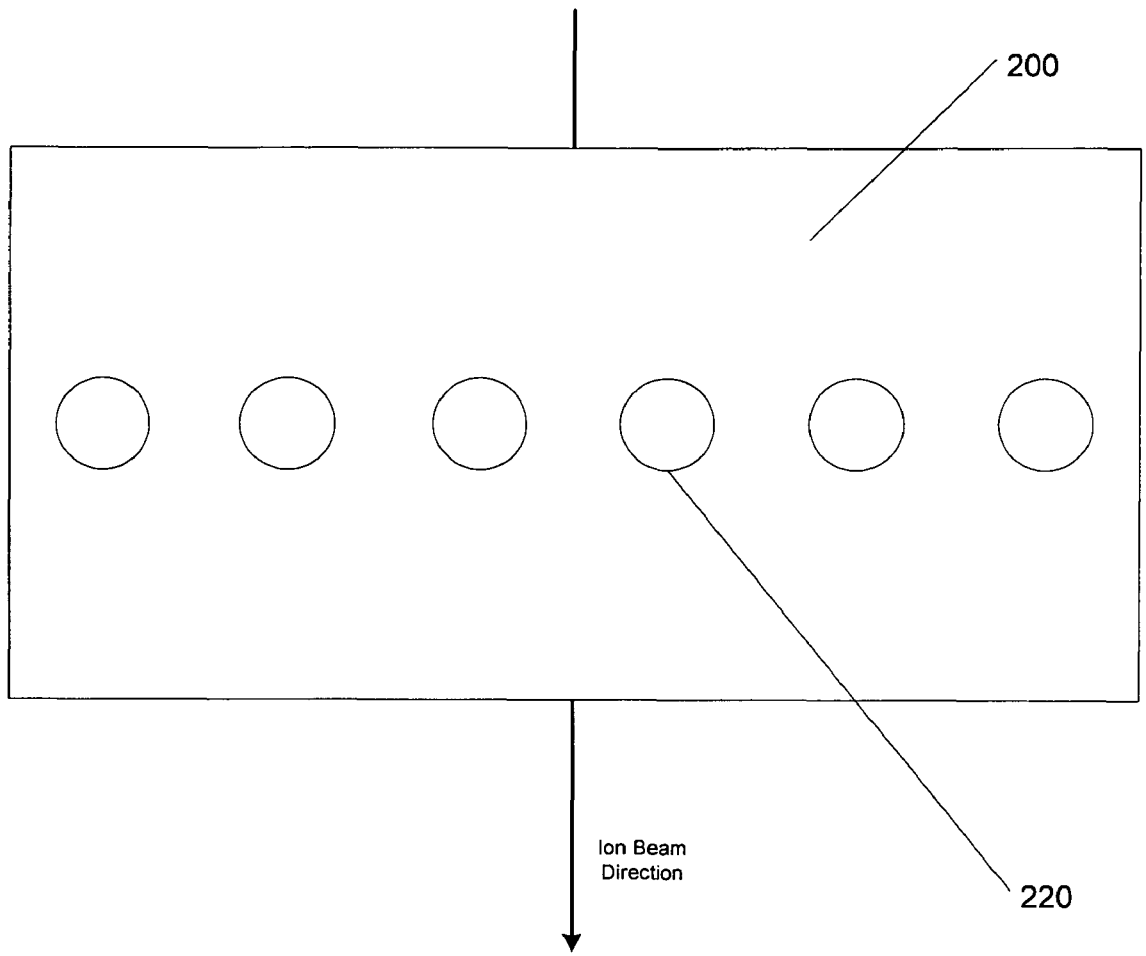
FIG. 4 represents a top view of a second embodiment of the electrodes shown in FIG. 2, taken in the x-z plane.

FIG. 4 shows a second embodiment. In this embodiment, rather than using elongated strips, electrically conductive elements, such as pins are used. These pins can be arranged as a single row of pins, as shown in FIG. 4. As described above, each of these pins is preferably in communication with a separate power supply so as to enable the creation of bias voltages, independent of the other pins.

In both embodiments, the electrodes 220 are preferably insulated from the magnet. The bias voltages applied to the electrodes 220 can be static (i.e. DC voltage), or more preferably, a pulsed D.C. voltage. A pulse of positive voltage will cause the electrons in the ion beam to move toward the electrode. This causes the ion beam to become de-neutralized, or "blow up", in that region, due to space charge effects. As the ion beam continues to pass through the magnet, it regains its shape, although its ion concentration has been reduced. The magnitude and duration of the bias voltage pulse determines the amount of expansion experienced by the ion beam. In other embodiments, a negative bias voltage can be used. For example, low energy boron ion beams can be enhanced by the use of negative bias voltages.

Figure 5:
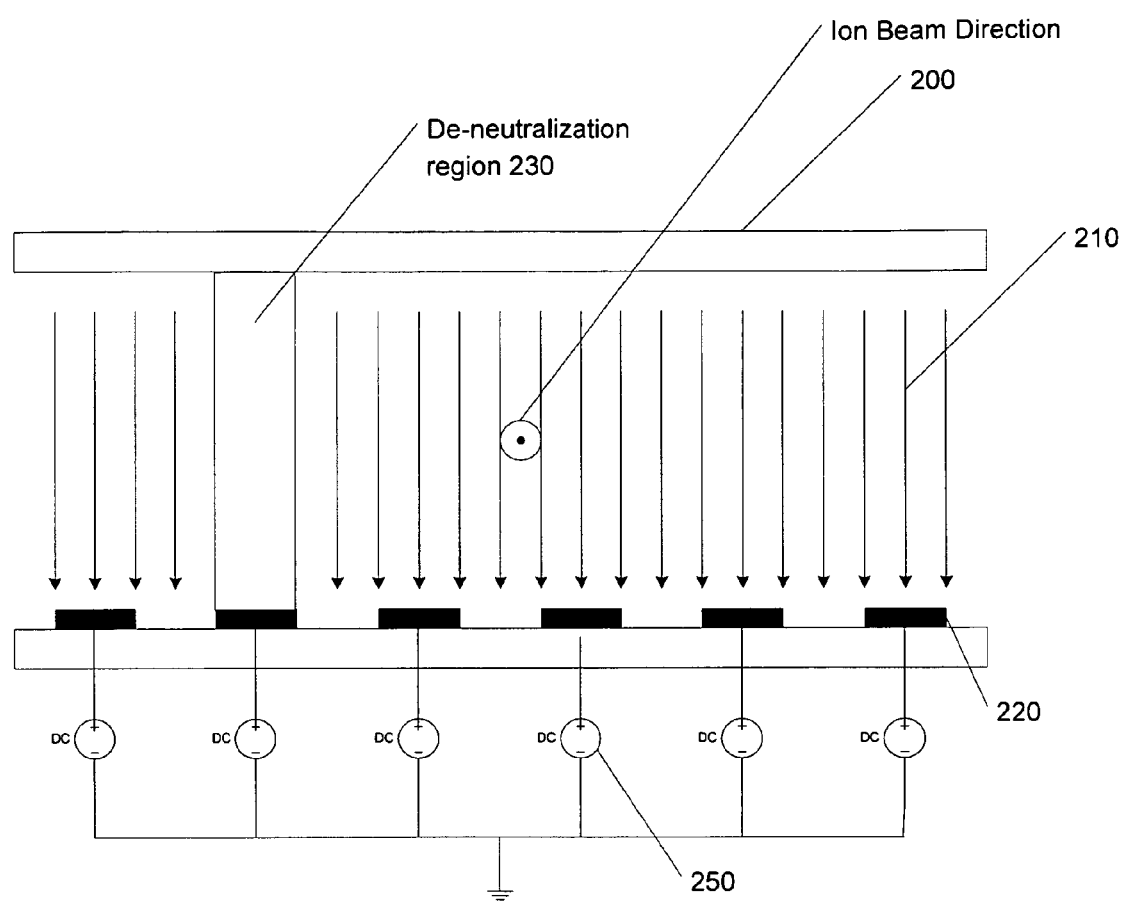
FIG. 5 represents a cross-section of a collimator magnet in the x-y plane and shows the effects of the electrodes as used in accordance with a first embodiment.

In certain embodiments, the electrodes 220 are well within the boundaries of the magnet, such as more than 2-3 inches, so that the magnetic field has a significant vertical component ($B_y$), with little or no $B_x$ or $B_z$ component. Therefore, the existing magnetic field and the electric field created by the application of the bias voltage are in the same direction. Thus, the electrons are somewhat restricted in their motion, as charged particles are reluctant to cross magnetic field lines. Therefore, the ion beam expansion described above remains very localized. In other words, the electrode only controls that portion of the ion beam that exists in the volume defined by the magnetic field lines and the element itself. FIG. 5 shows an example of this localized effect in creating a deneutralization region 230. The deneutralization region appears as a rectangular column, defined by the electrode on one side and the height of the magnet on the other side.

Since this technique is primarily used to reduce the concentration of ions, it is used to reduce the intensity of the beam to its lowest level. In other words, this technique is not used to bring all portions of the ion beam to the average value. Rather, it is used to bring all portions of the ion beam to the lowest value.

In certain embodiments, as shown in FIGS. 2 and 5, the electrodes 200 are only placed on one pole of the magnet. In alternate embodiments, electrodes 200 are placed on both the north and south poles.

Figure 6:
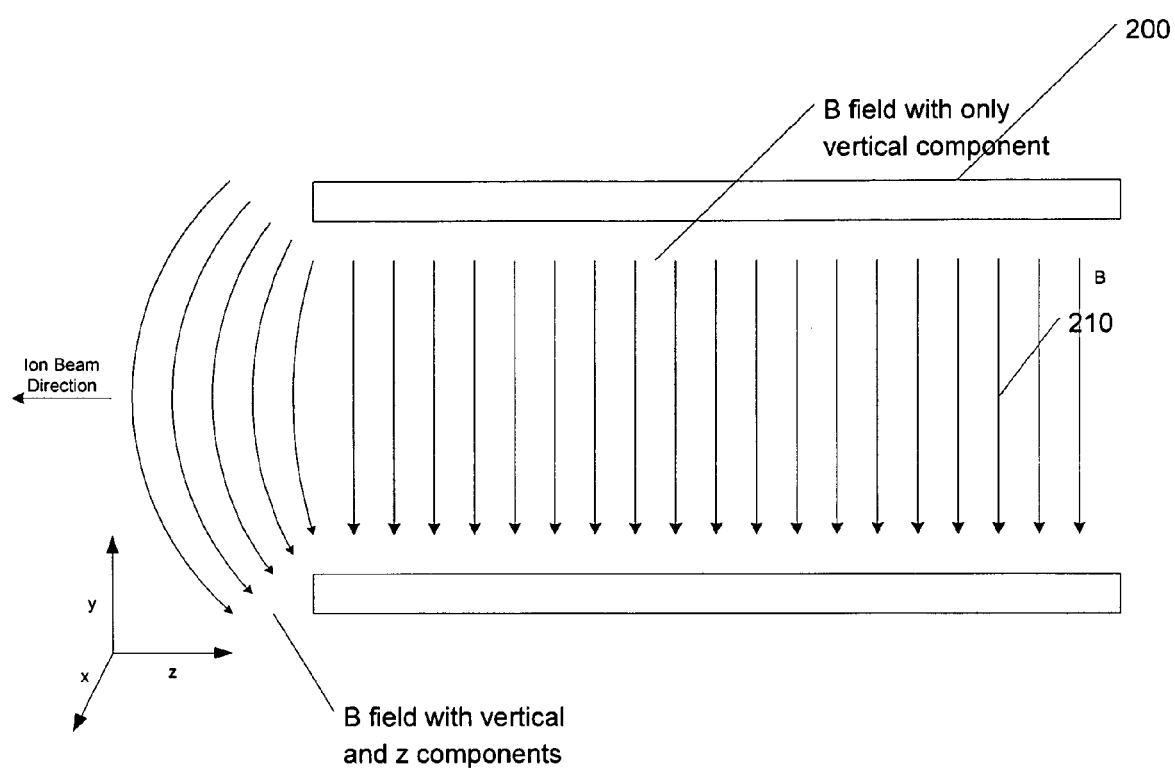
FIG. 6 represents a cross-section of a collimator magnet taken along the y-z plane and shows the magnetic field lines at the edge of the collimator magnet.

In a second embodiment, the electrodes are placed near the edge of the collimator magnet, or outside the edge of the magnet, but within the magnetic field. In these locations, the magnetic field has a z component, due to the irregularly shaped magnetic field lines, as seen in FIG. 6. In certain embodiments, the electrodes 220 are placed on the edge nearest the workpiece 175, as the beam has greater parallelism at this location.

Figure 7:
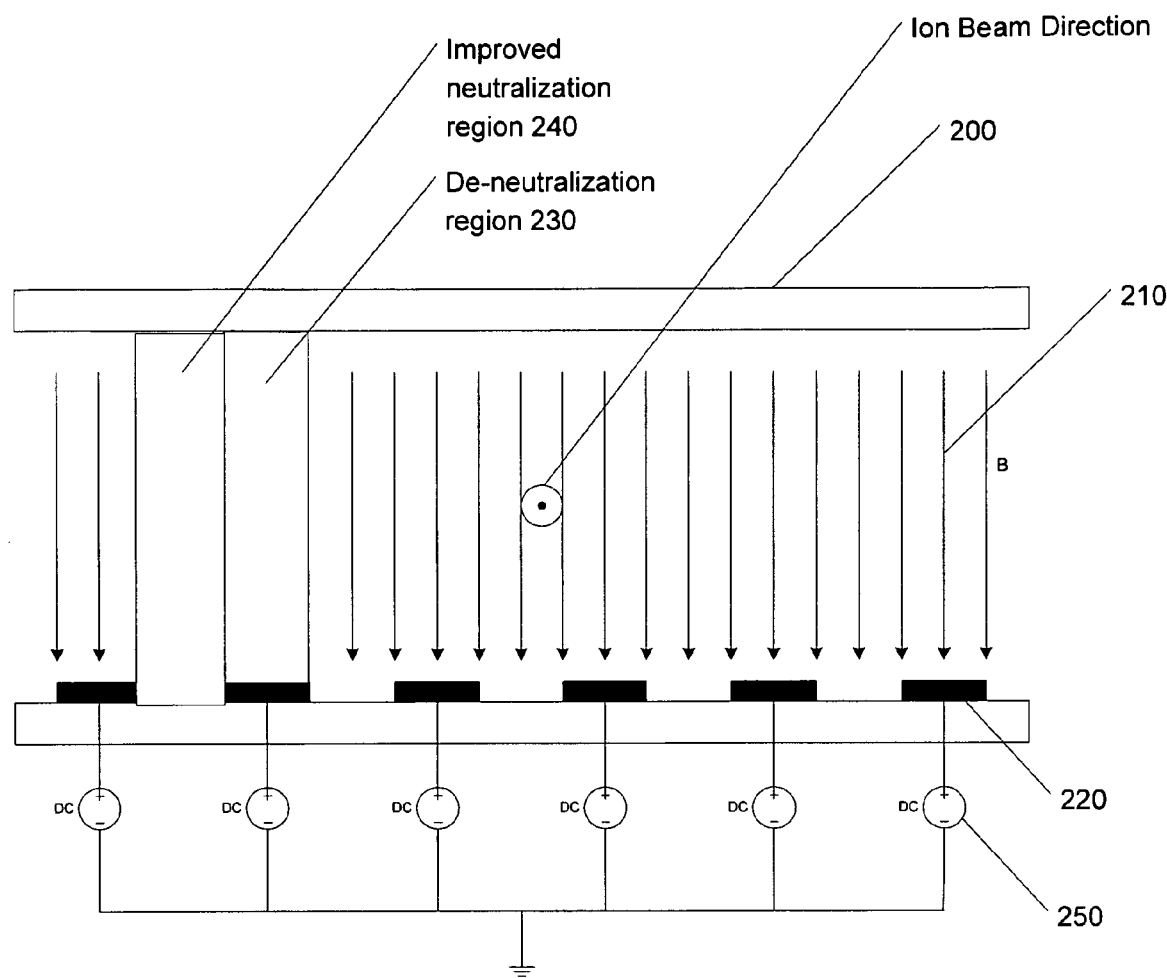
FIG. 7 represents a cross-section of a collimator magnet taken along the x-y plane and shows the effects of the electrodes as used in accordance with a second embodiment.

Since the magnetic field has a z component, the electrical field created by the electrodes crosses with this component of the magnetic field to create a force in the x direction. FIG. 7 shows the effects of a bias voltage in this embodiment. The application of a positive D.C. voltage to an electrode causes several effects. Electrons within the column defined by the electrode are accelerated toward the electrode. However, the electrons are pushed in the x direction due to the force created by the crossed E and B fields. Thus, the region defined by the electrode is stripped of electrons, creating a deneutralization region 230, where ions are not space charged neutralized. The region adjacent to this region receives a surplus of electrons, creating a region of improved space charge neutralization 240.

FIG. 7 shows each electrical element 220 having a dedicated power supply 250. This power supply 250 is capable of providing positive or negative voltage, and is capable of supplying a constant voltage or can generate voltage pulses. In other embodiments, these pulses can be of varying durations. In certain embodiments, each element is not in communication with a dedicated power supply, rather two or more elements share a common supply.

Figure 8:
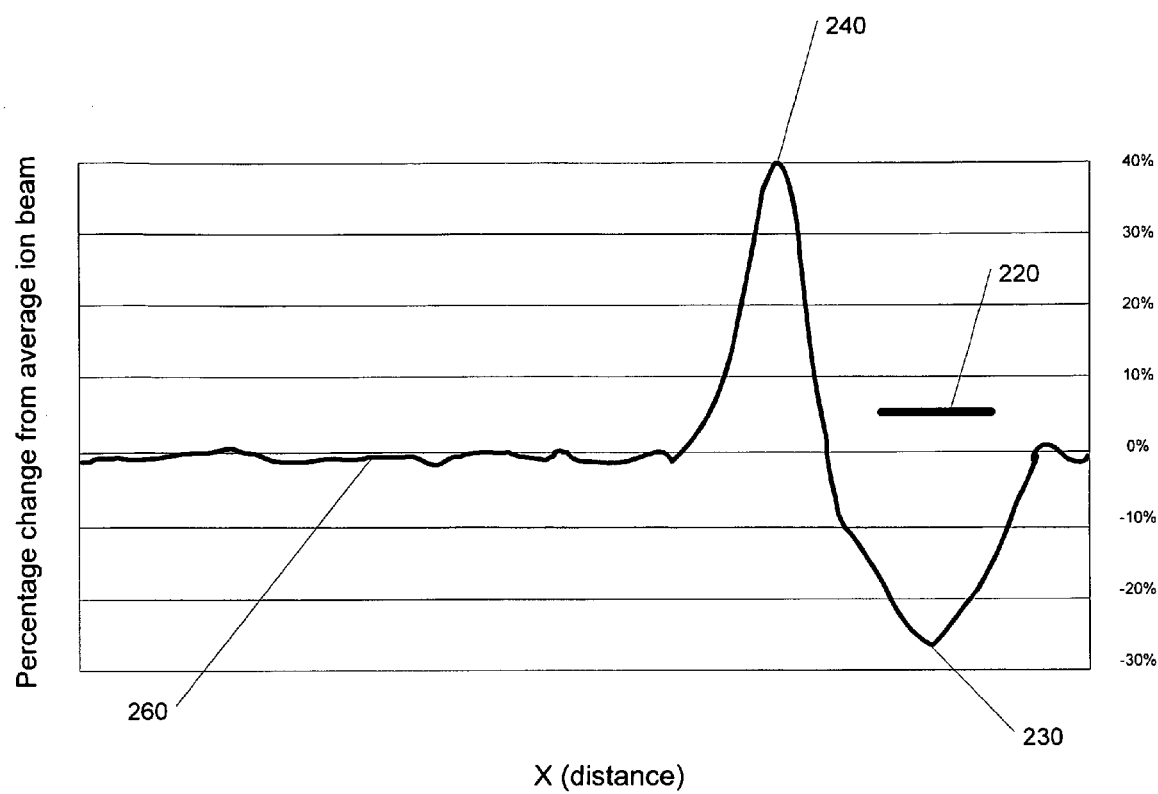
FIG. 8 represents a graph quantifiably showing the effects of the electrodes as used in accordance with a second embodiment.

The effect of energizing a single electrode 220 is best seen in FIG. 8. Line 260 represents the percentage change in the ion beam moving along the X dimension (as compared to an average ion beam). Element 220 is located at its respective X position within the magnetic field. Electrode 220 is energized with a positive voltage. In the regions located remote from the electrode, no change in the ion beam is detected. However, in the column directly above the electrode, the ion beam is decreased by about 30%. This corresponds to region 230 in FIG. 7. Because of the force created by the orthogonal magnetic and electrical fields, the region adjacent to the electrode 220 is increased by nearly 40%, which corresponds to region 240 in FIG. 7.

Note that FIG. 8 shows the region adjacent to the element 220 on its left is enhanced. This is due to the placement of the electrode with respect to the magnet. For example, by placing the electrode on the opposite pole, the force created would be in the opposite direction, and therefore the region adjacent to the right would be enhanced. Similarly, if the electrodes were placed on the opposite end of the magnet, the force created would be reversed.

Figure 9:
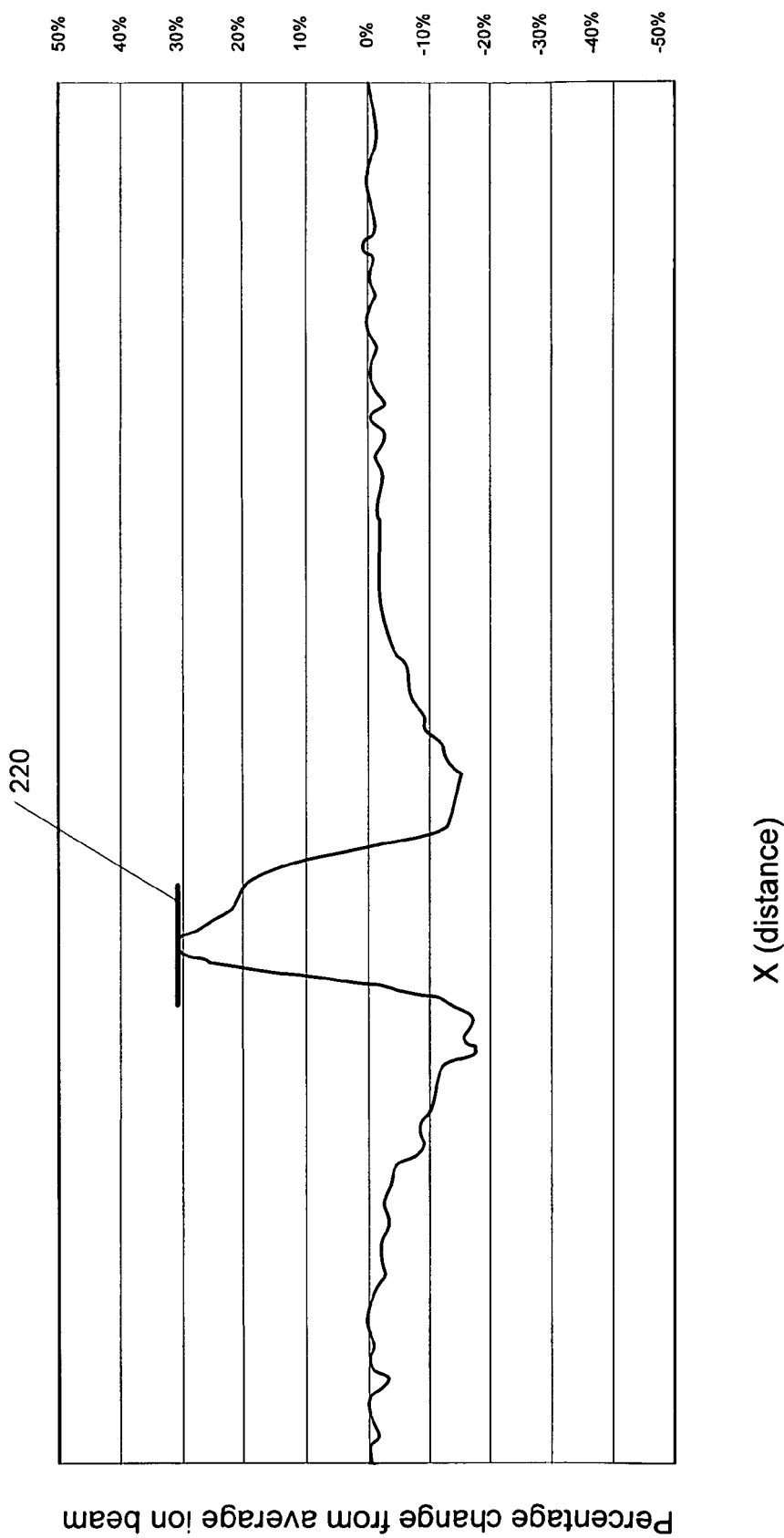
FIG. 9 represents a graph quantifiably showing the effects of a negative bias voltage when used with a boron ion beam.

FIG. 9 shows the effect of a negative bias voltage on a boron ion beam. Note that the ion density is greatly enhanced in the column where the energized electrode is located.

While these figures show the effects of energizing a single electrode, it is anticipated that a plurality of electrodes will be energized. In this scenario, the effects of each individual electrode add to the effects of the other energized electrodes, according to the laws of superposition and create an overall effect across the entire ion beam.

Figure 10:
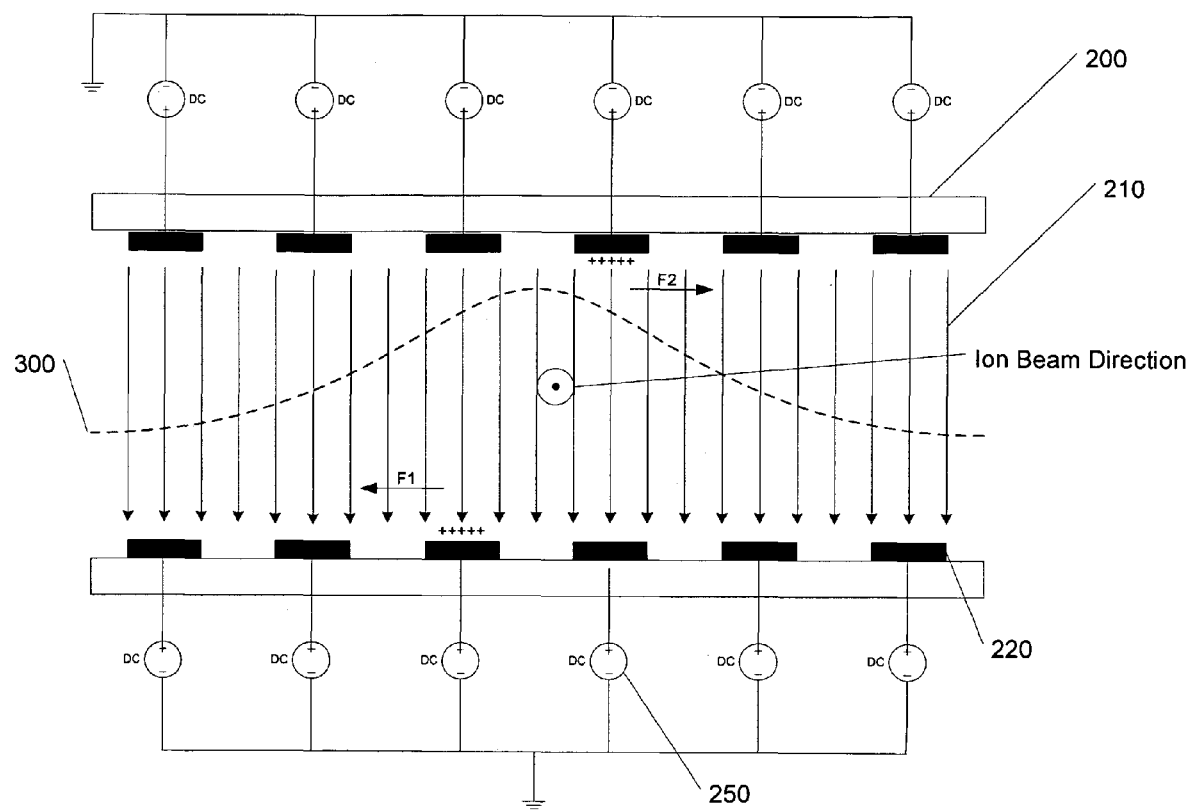
FIG. 10 represents a cross-section of a collimator magnet taken along the x-y plane, showing the use of elements on both poles.

As described above, it is within the scope of the disclosure to affix electrodes 220 on both poles. FIG. 10 shows one such embodiment. Note that in FIGS. 7 and 8, the beam was enhanced to the left of the energized element 220. This was due to the direction of the electrical and magnetic fields. By placing electrodes 220 on both poles, and selectively activating them, it is possible to create forces that push away from the centerline and toward the outside of the ion beam. Dashed line 300 represents the uneven ion density of the ion beam. Positive voltages are applied to two elements in this example, as denoted by the "+++++" symbols. The electron depleted column bound by the electrode(s) has a higher space potential due to space charge dominated by residual ions. As a result, an electric field appears across the sheath that separates the column from its boundary (the biased electrode). This electric field, in conjunction with the z component of the magnetic field, causes a drift of charged particles (plasma) in the direction of E×B. The directions of E and B reverse at opposite ends of the column, leading to drifts in the same direction. It is this plasma migration from one column to the adjacent one that causes an enhancement of beam transport in the adjacent region, thus an increase in propagated beam current. To reverse the direction of the drift, the z component of the B field has to be reversed. This can be done, for example, by locating a set of controlling electrodes in the other fringe (in the direction of propagation) of the dipole field.

Figure 1:
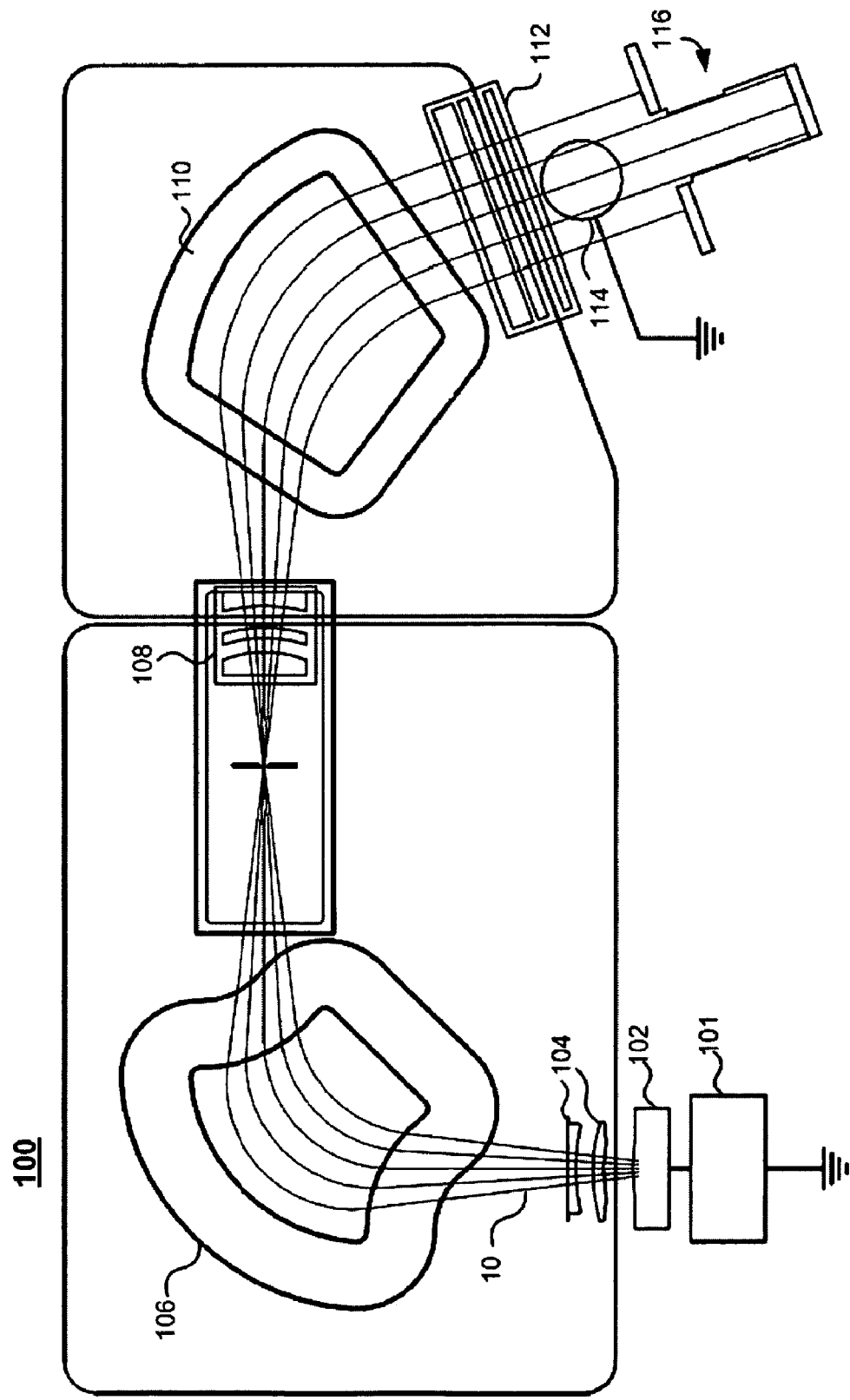
FIG. 1 represents a traditional ion implanter.

While the above disclosure describes the use of electrodes within the collimator magnet, the disclosure is not limited to this embodiment. In another embodiment, the electrodes are placed within the mass analyzer magnet 106. In another embodiment, an additional dipole magnetic field, separate from those traditionally present in FIG. 1, is inserted into the beamline. One possible placement of such a magnet field is between the collimator magnet 110 and the second deceleration stage 112. However, this additional magnetic field may be located anywhere in the beamline. In all cases, the dipole magnetic field is preferably created across the small dimension of the ribbon beam, as can be seen in FIG. 2. In these embodiments, the effect of the electrodes is as described above.

Measuring devices, such as Faraday cups, can be used to measure the resulting ion beam at a plurality of locations along the X dimension. These measurements then provide the feedback necessary to tune the bias voltages at the various elements 220. This feedback is preferably provided to control logic, which then determines which elements to energize, and the appropriate bias voltages and durations to be used. In this manner, the uniformity of the ion beam can be improved.

What is claimed is:

1. A method of modifying an ion beam, comprising:
   a. employing a ion beam implanter, having an ion source, a beamline that delivers a ribbon beam to a workpiece, and a dipole magnetic field oriented across the small dimension of the ribbon beam, located along said beamline;
   b. positioning a plurality of electrodes within said magnetic field;
   c. employing at least one power supply in communication with said electrodes adapted to supply a bias voltage;
   d. energizing at least one of said electrodes to create said bias voltage, so as to affect the charged particles within said ion beam, and thereby modify said beam.

2. The method of claim 1, wherein said bias voltage is a constant D.C. voltage.

3. The method of claim 1, wherein said bias voltage is a pulsed D.C. voltage.

4. The method of claim 1, further comprising employing a plurality of power supplies such that each electrode is in communication with a corresponding power supply.

5. The method of claim 4, wherein said power supplies are independently controlled.

6. The method of claim 4, further comprising energizing a plurality of said electrodes.

7. The method of claim 1, wherein said electrodes are positioned within said magnetic field such that the magnetic field comprises only a y component.

8. The method of claim 1, wherein said electrodes are positioned within said magnetic field such that the magnetic field comprises a y component and a z component.

9. The method of claim 1, further comprising measuring said ion beam at a plurality of locations, and using said measuring to determine which of said electrodes to energize.

10. The method of claim 1, wherein said dipole magnetic field comprises a collimator magnet.

11. The method of claim 1, wherein said dipole magnetic field is located downstream from a collimator magnet.

12. The method of claim 1, wherein said dipole magnetic field comprises a mass analyzer magnet.

13. An ion implanter, comprising:
   a. an ion source, and a beamline that delivers a ribbon beam to a workpiece;
   b. a dipole magnetic field oriented across the small dimension of said ribbon beam, located along said beamline;
   c. a plurality of electrodes positioned within said dipole magnetic field; and
   d. a power supply in communication with at least one of said electrodes, so as to create a bias voltage at said electrode.

14. The ion implanter of claim 13, wherein said bias voltage is a constant D.C. voltage.

15. The ion implanter of claim 13, wherein said bias voltage is a pulsed D.C. voltage.

16. The ion implanter of claim 13, further comprising a plurality of power supplies such that each electrode is in communication with a corresponding power supply.

17. The ion implanter of claim 16, wherein said power supplies are independently controlled.

18. The ion implanter of claim 13, wherein said electrodes are positioned within said magnetic field such that the magnetic field comprises only a y component.

19. The ion implanter of claim 13, wherein said electrodes are positioned within said magnetic field such that the magnetic field comprises a y component and a z component.

20. The ion implanter of claim 13, further comprising faraday cups to measure the resulting ion beam at a plurality of locations.

21. The ion implanter of claim 20, further comprising control logic to use said measurements to determine which elements to energize.

22. The ion implanter of claim 13, wherein said dipole magnetic field comprises a collimator magnet.

23. The ion implanter of claim 13, wherein said dipole magnetic field comprises a mass analyzer magnet.

* * * * *